US010925125B2

(12) United States Patent
Hua et al.

(10) Patent No.: US 10,925,125 B2
(45) Date of Patent: Feb. 16, 2021

(54) PLANAR INDUCTORS FOR RF HEATING SYSTEMS

(71) Applicant: NXP USA, Inc., Austin, TX (US)

(72) Inventors: Qi Hua, Wuxi (CN); Changyang Wang, Shanghai (CN)

(73) Assignee: NXP USA, Inc., Austin, TX (US)

( * ) Notice: Subject to any disclaimer, the term of this patent is extended or adjusted under 35 U.S.C. 154(b) by 280 days.

(21) Appl. No.: 16/115,041

(22) Filed: Aug. 28, 2018

(65) Prior Publication Data

US 2019/0208586 A1 Jul. 4, 2019

(30) Foreign Application Priority Data

Dec. 29, 2017 (CN) .......................... 2017 1 1498710

(51) Int. Cl.
*H03H 7/40* (2006.01)
*H05B 6/48* (2006.01)
*H05B 6/54* (2006.01)
*H05B 6/64* (2006.01)
*H05B 6/50* (2006.01)
*H05B 6/62* (2006.01)

(52) U.S. Cl.
CPC ............... *H05B 6/50* (2013.01); *H03H 7/40* (2013.01); *H05B 6/54* (2013.01); *H05B 6/62* (2013.01); *H05B 6/647* (2013.01)

(58) Field of Classification Search
CPC ........ H05B 6/48–52; H05B 6/54; H05B 6/62; H05B 6/64; H05B 6/6447–6467; H03H 7/40
See application file for complete search history.

(56) References Cited

U.S. PATENT DOCUMENTS

| 5,424,961 | A * | 6/1995 | Brust ..................... G01R 19/25 702/57 |
| 6,247,395 | B1 | 6/2001 | Yamamoto |
| 6,784,405 | B2 | 8/2004 | Flugstad et al. |
| 8,207,479 | B2 | 6/2012 | Ben-Shmuel et al. |
| 9,215,756 | B2 | 12/2015 | Bilchinsky et al. |

(Continued)

FOREIGN PATENT DOCUMENTS

| EP | 1075799 A1 | 2/2001 |
| EP | 3280225 A1 | 2/2018 |

(Continued)

OTHER PUBLICATIONS

Mohan, S. S. et al. "Simple accurate expressions for planar spiral inductances", IEEE Journal of Solid-State Circuits, vol. 34, pp. 1419-1424 (Oct. 1999).

(Continued)

*Primary Examiner* — Michael A Laflame, Jr.
(74) *Attorney, Agent, or Firm* — Sherry W. Schumm

(57) ABSTRACT

A solid-state heating apparatus may be incorporated into stand-alone appliances or other systems. The heating apparatus may include an impedance matching network coupled between an electrode and a radio-frequency (RF) source. The impedance matching network may be a variable impedance matching network that can be adjusted during the heating operation. The impedance matching network may include planar inductors formed from patterned conductive layers disposed either side of a substrate.

20 Claims, 9 Drawing Sheets

(56) References Cited

U.S. PATENT DOCUMENTS

| | | |
|---|---|---|
| 9,298,873 B2 | 3/2016 | Ishizuka et al. |
| 2002/0047009 A1 | 4/2002 | Flugstad et al. |
| 2006/0081624 A1 | 4/2006 | Takada et al. |
| 2006/0160501 A1* | 7/2006 | Mendolia ............... H01Q 1/242 |
| | | 455/125 |
| 2012/0122072 A1 | 5/2012 | Bilchinsky et al. |
| 2013/0063223 A1 | 3/2013 | See et al. |
| 2013/0119017 A1 | 5/2013 | Yang et al. |
| 2013/0134877 A1 | 5/2013 | Kim et al. |
| 2013/0207872 A1 | 8/2013 | Bakalski |
| 2014/0036396 A1* | 2/2014 | Jin ........................ H01L 23/60 |
| | | 361/56 |
| 2014/0097912 A1 | 4/2014 | Lee |
| 2015/0178434 A1 | 6/2015 | Ishizuka et al. |
| 2015/0341013 A1* | 11/2015 | Vemula ................. H01L 23/66 |
| | | 333/17.3 |
| 2015/0351164 A1 | 12/2015 | Wesson et al. |
| 2016/0259872 A1 | 9/2016 | Valcore, Jr. et al. |
| 2016/0308506 A1 | 10/2016 | Cheng et al. |
| 2017/0012599 A1* | 1/2017 | Iwanaga ................ H01Q 21/30 |
| 2018/0042074 A1 | 2/2018 | Qiu et al. |

FOREIGN PATENT DOCUMENTS

| | | |
|---|---|---|
| WO | WO-00/51450 A1 | 9/2000 |
| WO | WO-03019985 A1 | 3/2003 |

OTHER PUBLICATIONS

Cottee, C. J. et al. "Design of matching circuit controllers for radio-frequency heating", IEEE Transactions on Control Systems Technology, vol. 11, No. 1, pp. 91-100 (Jan. 2003).

* cited by examiner

PLANAR INDUCTORS FOR RF HEATING SYSTEMS

CROSS-REFERENCE TO RELATED APPLICATION

This application claims the priority under 35 U.S.C. § 119 to Chinese Patent application no. 201711498710.1, filed on Dec. 29, 2017.

TECHNICAL FIELD

Embodiments of the subject matter described herein relate generally to apparatus and methods of defrosting and/or heating a load with radio frequency (RF) energy.

BACKGROUND

Conventional capacitive food heating (or defrosting or thawing) systems include large planar electrodes contained within a heating compartment. After a food load is placed between the electrodes and the electrodes are brought into contact with the food load, low power electromagnetic energy is supplied to the electrodes to provide gentle warming of the food load.

BRIEF DESCRIPTION OF THE DRAWINGS

A more complete understanding of the subject matter may be derived by referring to the detailed description and claims when considered with the following figures, wherein like reference numbers refer to similar elements throughout the figures.

DETAILED DESCRIPTION

Figure 1:
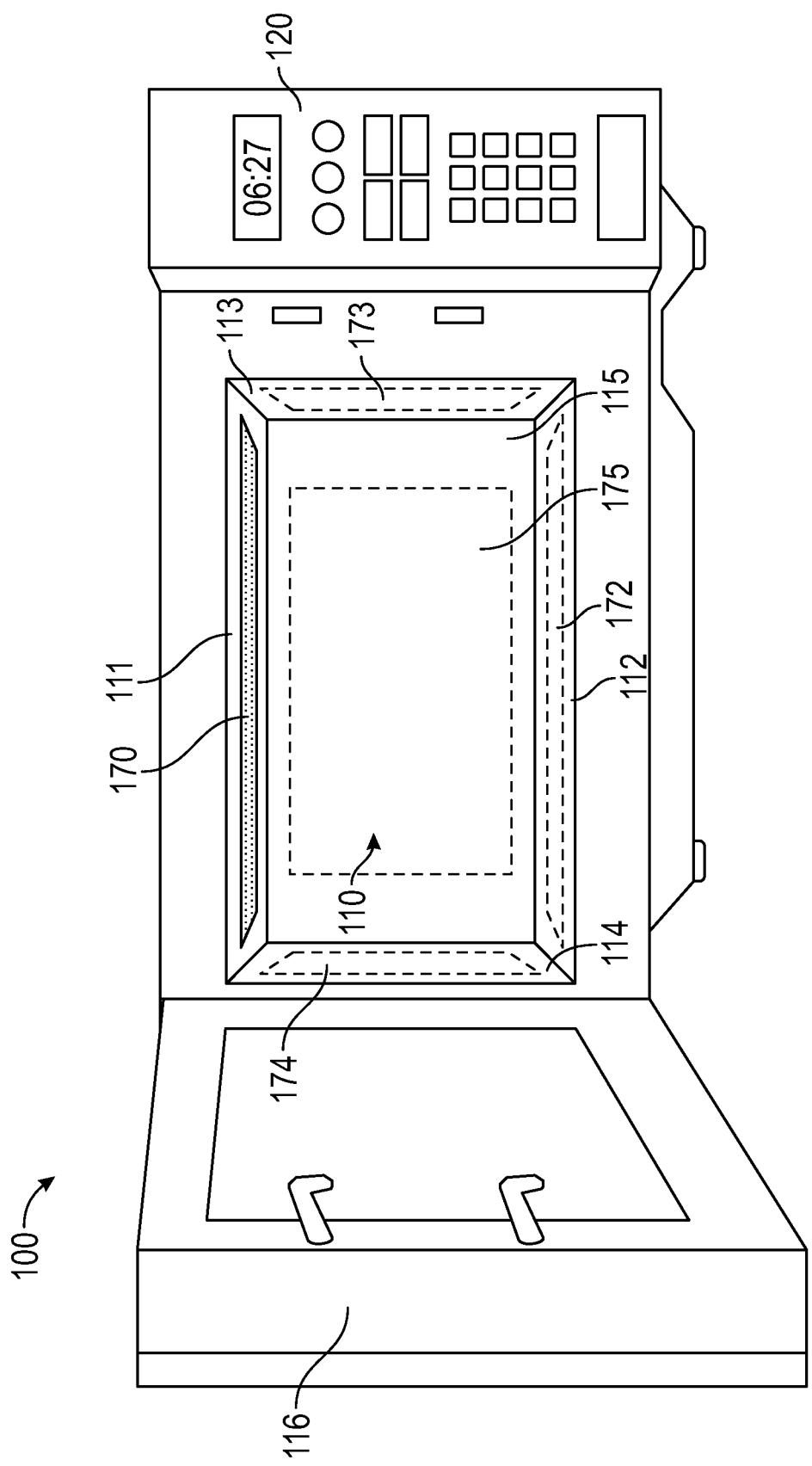
FIG. 1 is a perspective view of a heating appliance, in accordance with an example embodiment.

The following detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the following detailed description.

Embodiments of the subject matter described herein relate to solid-state heating apparatus that may be incorporated into stand-alone appliances or into other systems. As described in greater detail below, exemplary heating systems are realized using a first electrode disposed in a cavity, an amplifier arrangement (including one or more transistors), and an impedance matching network coupled between an output of the amplifier arrangement and the first electrode that includes planar inductors. In an embodiment, the impedance matching network is a variable impedance matching network that can be adjusted during the heating operation to improve matching between the amplifier arrangement and the cavity.

As used herein, the term "heating" more broadly means a process by which the thermal energy or temperature of a load (e.g., a food load or other type of load) is increased through provision of RF power to the load. Accordingly, in various embodiments, a "heating operation" may be performed on a load with any initial temperature (e.g., any initial temperature above or below 0 degrees Celsius), and the heating operation may be ceased at any final temperature that is higher than the initial temperature (e.g., including final temperatures that are above or below 0 degrees Celsius). That said, the "heating operations" and "heating systems" described herein alternatively may be referred to as "thermal increase operations" and "thermal increase systems." The term "defrosting" means to elevate the temperature of a frozen load (e.g., a food load or other type of load) to a temperature at which the load is no longer frozen (e.g., a temperature at or near 0 degrees Celsius). Accordingly, a "defrosting operation" is a type of "heating operation," and a "defrosting system" is a type of "heating system." The term "defrosting" should not be construed to limit application of the invention to methods or systems that are only capable of raising the temperature of a frozen load to a temperature at or near 0 degrees Celsius. Note that in the present disclosure, references to a "food load" are made as an example of a load for the heating system and it should be understood that references to a food load may also refer to other types of loads (e.g., liquids, non-consumable materials) that may be heated by the heating system.

In some food heating systems, electromagnetic energy is supplied to the electrodes through an impedance matching network. Some food heating systems include impedance matching networks that incorporate large helical inductors. These helical inductors may be costly and difficult to manufacture and tune to a desired inductance. Additionally, once installed in a system, the helical inductors may be susceptible to changes in their electrical characteristics (e.g., inductance) caused by excessive vibration. As the helical inductors are generally made from copper, excessive heat may cause the helical inductors to expand, which may also lead to changes in electrical characteristics of the helical inductors. These changes in electrical characteristics could potentially result in a reduction in system efficiency (e.g., by changing the impedance of the impedance matching network). Additionally, the large size of the helical inductors may require a proportionally large amount of space to house the impedance network. Thus, it therefore may be advantageous to use a heating system that includes an impedance network that utilizes planar inductors instead of helical inductors so that cost, difficulty of manufacturing, and system size may be comparatively reduced while the system may be made more robust against excessive vibration and temperature.

FIG. 1 is a perspective view of a heating system 100, in accordance with an example embodiment. Heating system 100 includes a heating cavity 110, a control panel 120, one or more radio frequency (RF) signal sources (e.g., RF signal source 340, FIG. 3), a power supply (e.g., power supply 350, FIG. 3), a first electrode 170, power detection circuitry (e.g., power detection circuitry 380, FIG. 3), and a system controller (e.g., system controller 330, FIG. 3). The heating cavity 110 is defined by interior surfaces of top, bottom, side, and back cavity walls 111, 112, 113, 114, 115 and an interior surface of door 116. With door 116 closed, the heating cavity 110 defines an enclosed air cavity. As used herein, the term "air cavity" may mean an enclosed area that contains air or other gasses (e.g., heating cavity 110).

According to an embodiment, the first electrode 170 is arranged proximate to a cavity wall (e.g., top wall 111), the first electrode 170 is electrically isolated from the remaining cavity walls (e.g., walls 112-115 and door 116), and the remaining cavity walls are grounded. In such a configuration, the system may be simplistically modeled as a capacitor, where the first electrode 170 functions as one conductive plate, the grounded cavity walls (e.g., walls 112-115) function as a second conductive plate (or electrode), and the air cavity (including any load contained therein) function as a dielectric medium between the first and second conductive plates. Although not shown in FIG. 1, a non-electrically conductive barrier (e.g., barrier 314, FIG. 3) also may be included in the system 100, and the non-conductive barrier may function to electrically and physically isolate the load from the bottom cavity wall 112. Although FIG. 1 shows the first electrode 170 being proximate to the top wall 111, the first electrode 170 alternatively may be proximate to any of the other walls 112-115, as indicated by alternate electrodes 172-175.

According to an embodiment, during operation of the heating system 100, a user (not illustrated) may place one or more loads (e.g., food and/or liquids) into the heating cavity 110, and optionally may provide inputs via the control panel 120 that specify characteristics of the load(s). For example, the specified characteristics may include an approximate weight of the load. In addition, the specified load characteristics may indicate the material(s) from which the load is formed (e.g., meat, bread, liquid). In alternate embodiments, the load characteristics may be obtained in some other way, such as by scanning a barcode on the load packaging or receiving a radio frequency identification (RFID) signal from an RFID tag on or embedded within the load. Either way, as will be described in more detail later, information regarding such load characteristics enables the system controller (e.g., system controller 330, FIG. 3) to establish an initial state for the impedance matching network of the system at the beginning of the heating operation, where the initial state may be relatively close to an optimal state that enables maximum RF power transfer into the load. Alternatively, load characteristics may not be entered or received prior to commencement of a heating operation, and the system controller may establish a default initial state for the impedance matching network.

To begin the heating operation, the user may provide an input via the control panel 120. In response, the system controller causes the RF signal source(s) (e.g., RF signal source 340, FIG. 3) to supply an RF signal to the first electrode 170, which responsively radiates electromagnetic energy into the heating cavity 110. The electromagnetic energy increases the thermal energy of the load (i.e., the electromagnetic energy causes the load to warm up).

During the heating operation, the impedance of the load (and thus the total input impedance of the cavity 110 plus load) changes as the thermal energy of the load increases. The impedance changes alter the absorption of RF energy into the load, and thus alter the magnitude of reflected power. According to an embodiment, power detection circuitry (e.g., power detection circuitry 380, FIG. 3) continuously or periodically measures the forward and reflected power along a transmission path (e.g., transmission path 348, FIG. 3) between the RF signal source (e.g., RF signal source 340, FIG. 3) and the first electrode 170. Based on these measurements, the system controller (e.g., system controller 330, FIG. 3) may detect completion of the heating operation, as will be described in detail below. According to a further embodiment, the impedance matching network is variable, and based on the forward and reflected power measurements, the system controller may alter the state of the impedance matching network during the heating operation to increase the absorption of RF power by the load.

Figure 2:
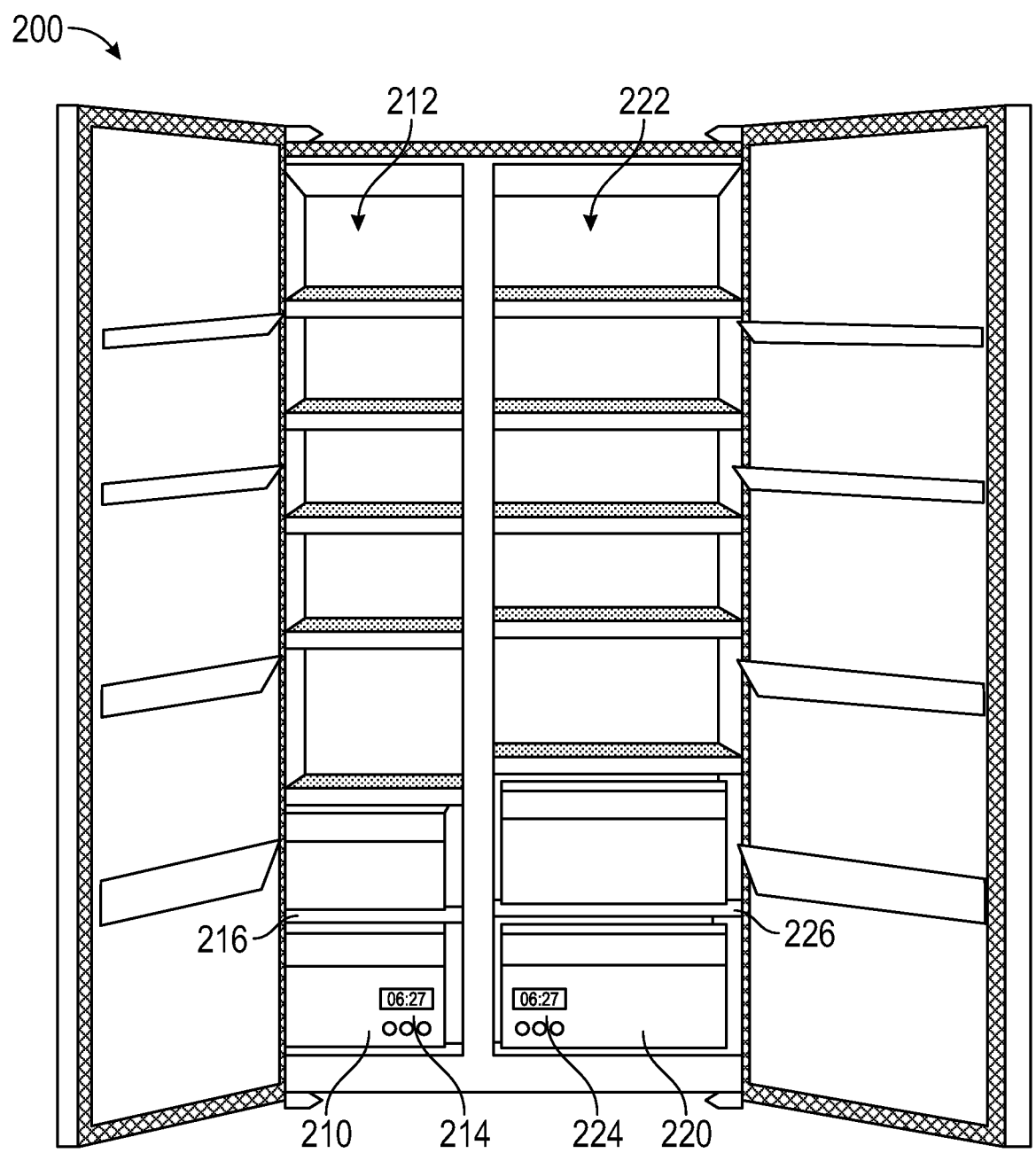
FIG. 2 is a perspective view of a refrigerator/freezer appliance that includes other example embodiments of heating systems.

Components of a heating system may be incorporated into other types of systems or appliances. For example, FIG. 2 is a perspective view of a refrigerator/freezer appliance 200 that includes other example embodiments of heating systems 210, 220. More specifically, heating system 210 is shown to be incorporated within a freezer compartment 212 of the system 200, and heating system 220 is shown to be incorporated within a refrigerator compartment 222 of the system. An actual refrigerator/freezer appliance likely would include only one of the heating systems 210, 220, but both are shown in FIG. 2 to concisely convey both embodiments.

Figure 3:
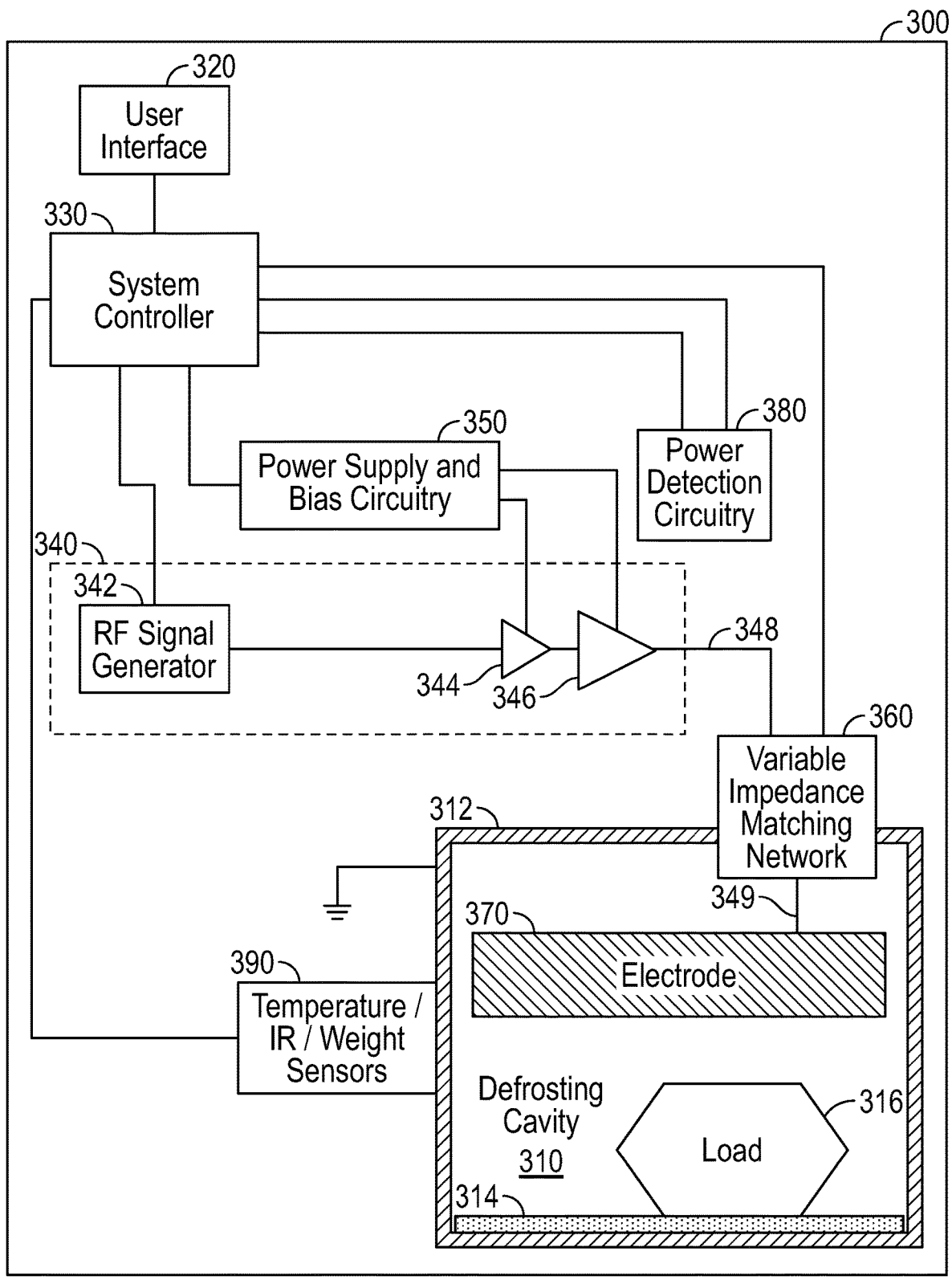
FIG. 3 is a simplified block diagram of a heating apparatus, in accordance with an example embodiment.

Similar to the heating system 100, each of heating systems 210, 220 includes a heating cavity, a control panel 214, 224, one or more RF signal sources (e.g., RF signal source 340, FIG. 3), a power supply (e.g., power supply 350, FIG. 3), a first electrode (e.g., electrode 370, FIG. 3), power detection circuitry (e.g., power detection circuitry 380, FIG. 3), and a system controller (e.g., system controller 330, FIG. 3). For example, the heating cavity may be defined by interior surfaces of bottom, side, front, and back walls of a drawer, and an interior top surface of a fixed shelf 216, 226 under which the drawer slides. With the drawer slid fully under the shelf, the drawer and shelf define the cavity as an enclosed air cavity. The components and functionalities of the heating systems 210, 220 may be substantially the same as the components and functionalities of heating system 100, in various embodiments.

In addition, according to an embodiment, each of the heating systems 210, 220 may have sufficient thermal communication with the freezer or refrigerator compartment 212, 222, respectively, in which the system 210, 220 is disposed. In such an embodiment, after completion of a heating operation, the load may be maintained at a safe temperature (i.e., a temperature at which food spoilage is retarded) until the load is removed from the system 210, 220. More specifically, upon completion of a heating operation by the freezer-based heating system 210, the cavity within which the heated load is contained may thermally communicate with the freezer compartment 212, and if the load is not promptly removed from the cavity, the load may refreeze. Similarly, upon completion of a heating operation by the refrigerator-based heating system 220, the cavity within which the heated load is contained may thermally communicate with the refrigerator compartment 222, and if the load is not promptly removed from the cavity, the load may be maintained in a heated state at the temperature within the refrigerator compartment 222.

Those of skill in the art would understand, based on the description herein, that embodiments of heating systems may be incorporated into systems or appliances having other configurations, as well. Accordingly, the above-described implementations of heating systems in a stand-alone appliance, a microwave oven appliance, a freezer, and a refrigerator are not meant to limit use of the embodiments only to those types of systems.

Although heating systems 100, 200 are shown with their components in particular relative orientations with respect to one another, it should be understood that the various components may be oriented differently, as well. In addition, the physical configurations of the various components may be different. For example, control panels 120, 214, 224 may have more, fewer, or different user interface elements, and/or the user interface elements may be differently arranged. In addition, although a substantially cubic heating cavity 110 is illustrated in FIG. 1, it should be understood that a heating cavity may have a different shape, in other embodiments (e.g., cylindrical, and so on). Further, heating systems 100, 210, 220 may include additional components (e.g., a fan, a stationary or rotating plate, a tray, an electrical cord, and so on) that are not specifically depicted in FIGS. 1, 2.

FIG. 3 is a simplified block diagram of a heating system 300 (e.g., heating system 100, 210, 220, FIGS. 1, 2), in accordance with an example embodiment. Heating system 300 includes heating cavity 310, user interface 320, system controller 330, RF signal source 340, power supply and bias circuitry 350, variable impedance matching network 360, electrode 370, and power detection circuitry 380, in an embodiment. In addition, in other embodiments, heating system 300 may include temperature sensor(s), infrared (IR) sensor(s), and/or weight sensor(s) 390, although some or all of these sensor components may be excluded. It should be understood that FIG. 3 is a simplified representation of a heating system 300 for purposes of explanation and ease of description, and that practical embodiments may include other devices and components to provide additional functions and features, and/or the heating system 300 may be part of a larger electrical system.

User interface 320 may correspond to a control panel (e.g., control panel 120, 214, 224, FIGS. 1, 2), for example, which enables a user to provide inputs to the system regarding parameters for a heating operation (e.g., characteristics of the load to be heated, and so on), start and cancel buttons, mechanical controls (e.g., a door/drawer open latch), and so on. In addition, the user interface may be configured to provide user-perceptible outputs indicating the status of a heating operation (e.g., a countdown timer, visible indicia indicating progress or completion of the heating operation, and/or audible tones indicating completion of the heating operation) and other information.

System controller 330 may include one or more general purpose or special purpose processors (e.g., a microprocessor, microcontroller, Application Specific Integrated Circuit (ASIC), and so on), volatile and/or non-volatile memory (e.g., Random Access Memory (RAM), Read Only Memory (ROM), flash, various registers, and so on), one or more communication busses, and other components. According to an embodiment, system controller 330 is coupled to user interface 320, RF signal source 340, variable impedance matching network 360, power detection circuitry 380, and sensors 390 (if included). System controller 330 is configured to receive signals indicating user inputs received via user interface 320, and to receive forward and reflected power measurements from power detection circuitry 380. Responsive to the received signals and measurements, and system controller 330 provides control signals to the power supply and bias circuitry 350 and to the RF signal generator 342 of the RF signal source 340. In addition, system controller 330 provides control signals to the variable impedance matching network 360, which cause the network 360 to change its state or configuration.

Heating cavity 310 includes a capacitive heating arrangement with first and second parallel plate electrodes that are separated by an air cavity within which a load 316 to be heated may be placed. For example, a first electrode 370 may be positioned above the air cavity, and a second electrode may be provided by a portion of a containment structure 312. More specifically, the containment structure 312 may include bottom, top, and side walls, the interior surfaces of which define the cavity 310 (e.g., cavity 110, FIG. 1). In one embodiment, the second electrode (e.g., the containment structure 312) may be grounded. In another embodiment, the first and second electrodes may form portions of a balanced system in which RF signals approximately 180 degrees out of phase are provided to the electrodes. In this embodiment, the first and second electrodes are coupled through the variable impedance matching network and a balun to the amplifier 346.

Heating cavity 310 and any load 316 (e.g., food, liquids, and so on) positioned in the heating cavity 310 present a cumulative load for the electromagnetic energy (or RF power) that is radiated into the cavity 310 by the first electrode 370. More specifically, the cavity 310 and the load 316 present an impedance to the system, referred to herein as a "cavity input impedance." The cavity input impedance changes during a heating operation as the temperature of the load 316 increases. The impedance of many types of food loads changes with respect to temperature in a somewhat predictable manner as the food load transitions from a frozen state to a defrosted state. According to an embodiment, based on reflected and forward power measurements from the power detection circuitry 380, the system controller 330 is configured to identify a point in time during a defrosting operation when the rate of change of cavity input impedance indicates that the load 316 is approaching 0° Celsius, at which time the system controller 330 may terminate the defrosting operation.

The first electrode 370 is electrically coupled to the RF signal source 340 through a variable impedance matching network 360 and a transmission path 348, in an embodiment. As will be described in more detail later, the variable impedance matching circuit 360 is configured to perform an impedance transformation from an impedance of the RF signal source 340 to an input impedance of heating cavity 340 as modified by the load 316. In an embodiment, the variable impedance matching network 360 includes a network of passive components (e.g., inductors, capacitors, resistors). According to a more specific embodiment, the variable impedance matching network 360 includes a plurality of fixed-value inductors (e.g., inductors 412-415, 709, 812-815, FIGS. 4, 7, 8) that are positioned within the cavity 310 and which are electrically coupled to the first electrode 370. Some or all of these fixed-value inductors may be implemented as planar spiral inductors formed on a substrate. In addition, the variable impedance matching network 360 includes a plurality of variable inductance networks (e.g., networks 410, 411, 500, FIGS. 4, 5), which may be located inside or outside of the cavity 310. The inductance value provided by each of the variable inductance networks is established using control signals from the system controller 330, as will be described in more detail later. In any event, by changing the state of the variable impedance matching network 360 over the course of a heating operation to dynamically match the ever-changing cavity input impedance, the amount of RF power that is absorbed by the load 316 may be maintained at a high level despite variations in the load impedance during the heating operation.

According to an embodiment, RF signal source 350 includes an RF signal generator 342 and a power amplifier (e.g., including one or more power amplifier stages 344, 346). In response to control signals provided by system controller 330, RF signal generator 342 is configured to produce an oscillating electrical signal having a frequency in the ISM (industrial, scientific, and medical) band, although the system could be modified to support operations in other frequency bands, as well. The RF signal generator 342 may be controlled to produce oscillating signals of different power levels and/or different frequencies, in various embodiments. For example, the RF signal generator 342 may produce a signal that oscillates in a range of about 3.0 megahertz (MHz) to about 300 MHz. Some desirable frequencies may be, for example, 13.56 MHz (+/−5 percent), 27.125 MHz (+/−5 percent), and 40.68 MHz (+/−5 percent). In one particular embodiment, for example, the RF signal generator 342 may produce a signal that oscillates in a range of about 40.66 MHz to about 40.70 MHz and at a power level in a range of about 10 decibels (dB) to about 15 dB. Alternatively, the frequency of oscillation and/or the power level may be lower or higher than the above-given ranges or values.

In the embodiment of FIG. 3, the power amplifier includes a driver amplifier stage 344 and a final amplifier stage 346. The power amplifier is configured to receive the oscillating signal from the RF signal generator 342, and to amplify the signal to produce a significantly higher-power signal at an output of the power amplifier. For example, the output signal may have a power level in a range of about 100 watts to about 400 watts or more. The gain applied by the power amplifier may be controlled using gate bias voltages and/or drain supply voltages provided by the power supply and bias circuitry 350 to each amplifier stage 344, 346. More specifically, power supply and bias circuitry 350 provides bias and supply voltages to each RF amplifier stage 344, 346 in accordance with control signals received from system controller 330.

In an embodiment, each amplifier stage 344, 346 is implemented as a power transistor, such as a field effect transistor (FET), having an input terminal (e.g., a gate or control terminal) and two current carrying terminals (e.g., source and drain terminals). Impedance matching circuits (not illustrated) may be coupled to the input (e.g., gate) of the driver amplifier stage 344, between the driver and final amplifier stages 346, and/or to the output (e.g., drain terminal) of the final amplifier stage 346, in various embodiments. In an embodiment, each transistor of the amplifier stages 344, 346 includes a laterally diffused metal oxide semiconductor FET (LDMOSFET) transistor. However, it should be noted that the transistors are not intended to be limited to any particular semiconductor technology, and in other embodiments, each transistor may be realized as a gallium nitride (GaN) transistor, another type of MOSFET transistor, a bipolar junction transistor (BJT), or a transistor utilizing another semiconductor technology.

In FIG. 3, the power amplifier arrangement is depicted to include two amplifier stages 344, 346 coupled in a particular manner to other circuit components. In other embodiments, the power amplifier arrangement may include other amplifier topologies and/or the amplifier arrangement may include only one amplifier stage, or more than two amplifier stages. For example, the power amplifier arrangement may include various embodiments of a single ended amplifier, a double ended amplifier, a push-pull amplifier, a Doherty amplifier, a Switch Mode Power Amplifier (SMPA), or another type of amplifier.

Power detection circuitry 380 is coupled along the transmission path 348 between the output of the RF signal source 340 and the input to the variable impedance matching network 360, in an embodiment. In an alternate embodiment, power detection circuitry 380 may be coupled to the transmission path 349 between the output of the variable impedance matching network 360 and the first electrode 370. Either way, power detection circuitry 380 is configured to monitor, measure, or otherwise detect the power of the forward signals (i.e., from RF signal source 340 toward first electrode 370) and the reflected signals (i.e., from first electrode 370 toward RF signal source 340) traveling along the transmission path 348.

Power detection circuitry 380 supplies signals conveying the magnitudes of the forward and reflected signal power to system controller 330. System controller 330, in turn, may calculate a ratio of reflected signal power to forward signal power, or the S11 parameter. As will be described in more detail below, when the reflected to forward power ratio exceeds a threshold, this indicates that the system 300 is not adequately matched, and that energy absorption by the load 316 may be sub-optimal. In such a situation, system controller 330 orchestrates a process of altering the state of the variable impedance matching network until the reflected to forward power ratio decreases to a desired level, thus re-establishing an acceptable match and facilitating more optimal energy absorption by the load 316.

As mentioned above, some embodiments of heating system 300 may include temperature sensor(s), IR sensor(s), and/or weight sensor(s) 390. The temperature sensor(s) and/or IR sensor(s) may be positioned in locations that enable the temperature of the load 316 to be sensed during the heating operation. When provided to the system controller 330, the temperature information enables the system controller 330 to alter the power of the RF signal supplied by the RF signal source 340 (e.g., by controlling the bias and/or supply voltages provided by the power supply and bias circuitry 350), to adjust the state of the variable impedance matching network 360, and/or to determine when the heating operation should be terminated. The weight sensor(s) are positioned under the load 316, and are configured to provide an estimate of the weight of the load 316 to the system controller 330. The system controller 330 may use this information, for example, to determine a desired power level for the RF signal supplied by the RF signal source 340, to determine an initial setting for the variable impedance matching network 360, and/or to determine an approximate duration for the heating operation.

As discussed above, the variable impedance matching network 360 is used to match the input impedance of the heating cavity 310 plus load 316 to maximize, to the extent possible, the RF power transfer into the load 316. The initial impedance of the heating cavity 310 and the load 316 may not be known with accuracy at the beginning of a heating operation. Further, the impedance of the load 316 changes during a heating operation as the load 316 warms up. According to an embodiment, the system controller 330 may provide control signals to the variable impedance matching network 360, which cause modifications to the state of the variable impedance matching network 360. This enables the system controller 330 to establish an initial state of the variable impedance matching network 360 at the beginning of the heating operation that has a relatively low reflected to forward power ratio, and thus a relatively high absorption of the RF power by the load 316. In addition, this enables the system controller 330 to modify the state of the variable impedance matching network 360 so that an adequate match may be maintained throughout the heating operation, despite changes in the impedance of the load 316.

According to an embodiment, the variable impedance matching network 360 may include a network of passive components, and more specifically a network of fixed-value inductors (e.g., planar, spiral inductive components) and variable inductors (or variable inductance networks). As used herein, the term "inductor" means a discrete inductor or a set of inductive components that are electrically coupled together without intervening components of other types (e.g., resistors or capacitors).

Figure 4:
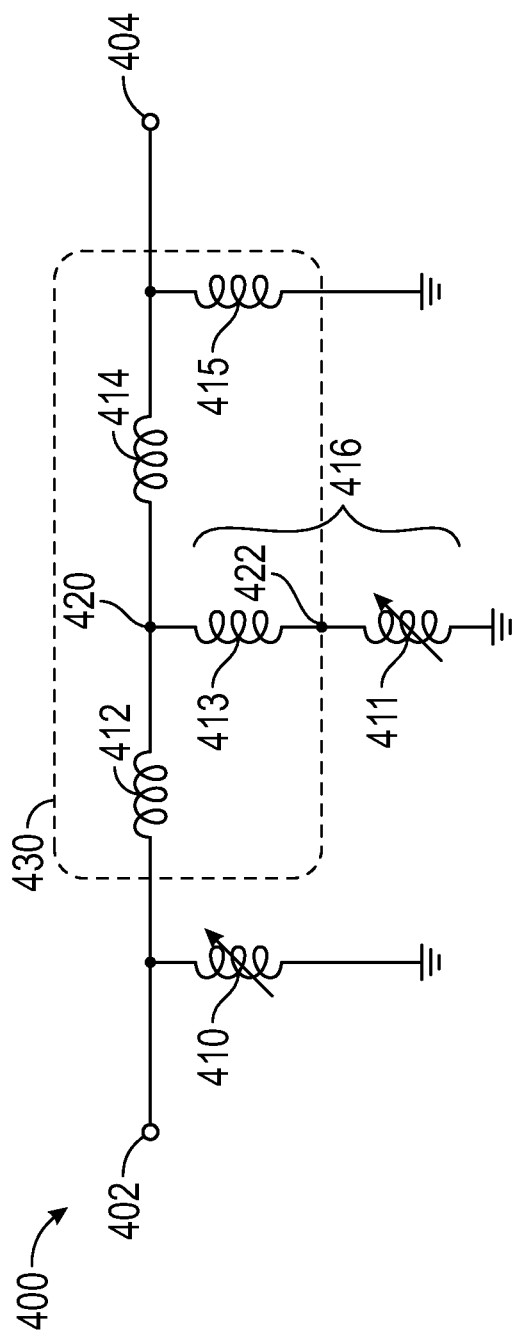
FIG. 4 is a schematic diagram of a variable inductance matching network, in accordance with an example embodiment.

FIG. 4 is a schematic diagram of a variable impedance matching network 400 (e.g., variable impedance matching network 360, FIG. 3), in accordance with an example embodiment. As will be explained in more detail below, the variable impedance matching network 360 essentially has two portions: one portion to match the RF signal source (or the final stage power amplifier); and another portion to match the cavity plus load.

Variable impedance matching network 400 includes an input node 402, an output node 404, first and second variable inductance networks 410, 411, and a plurality of fixed-value inductors 412-415, according to an embodiment. In some embodiments, fixed-value inductors 412-415 may be implemented as planar inductors (e.g., spiral inductors formed from a patterned conductive layer disposed on a substantially flat substrate). When incorporated into a heating system (e.g., system 300, FIG. 3), the input node 402 is electrically coupled to an output of the RF signal source (e.g., RF signal source 340, FIG. 3), and the output node 404 is electrically coupled to an electrode (e.g., first electrode 370, FIG. 3) within the heating cavity (e.g., heating cavity 310, FIG. 3).

Between the input and output nodes 402, 404, the variable impedance matching network 400 includes first and second, series coupled inductors 412, 414, in an embodiment. The first and second inductors 412, 414 are relatively large in both size and inductance value, in an embodiment, as they may be designed for relatively low frequency (e.g., about 4.66 MHz to about 4.68 MHz) and high power (e.g., about 50 watts (W) to about 500 W) operation. For example, inductors 412, 414 may have values in a range of about 200 nanohenries (nH) to about 600 nH, although their values may be lower and/or higher, in other embodiments.

The first variable inductance network 410 is a first shunt inductive network that is coupled between the input node 402 and a ground reference terminal (e.g., the grounded containment structure 312, FIG. 3). According to an embodiment, the first variable inductance network 410 is configurable to match the impedance of the RF signal source (e.g., RF signal source 340, FIG. 3), or more particularly to match the final stage power amplifier (e.g., amplifier 346, FIG. 3). Accordingly, the first variable inductance network 410 may be referred to as the "power amplifier matching portion" of the variable impedance matching network 400. According to an embodiment, and as will be described in more detail in conjunction with FIG. 7, the first variable inductance network 410 includes a network of inductive components that may be selectively coupled together to provide inductances in a range of about 20 nH to about 400 nH, although the range may extend to lower or higher inductance values, as well.

In contrast, the "cavity matching portion" of the variable impedance matching network 400 is provided by a second shunt inductive network 416 that is coupled between a node 420 between the first and second inductors 412, 414 and the ground reference terminal. According to an embodiment, the second shunt inductive network 416 includes a third inductor 413 and a second variable inductance network 411 coupled in series, with an intermediate node 422 between the third inductor 413 and the second variable inductance network 411. Because the state of the second variable inductance network 411 may be changed to provide multiple inductance values, the second shunt inductive network 416 is configurable to optimally match the impedance of the cavity plus load (e.g., cavity 310 plus load 316, FIG. 3). For example, inductor 413 may have a value in a range of about 400 nH to about 800 nH, although its value may be lower and/or higher, in other embodiments. According to an embodiment, and as will be described in more detail in conjunction with FIG. 7, the second variable inductance network 411 includes a network of inductive components that may be selectively coupled together to provide inductances in a range of about 50 nH to about 800 nH, although the range may extend to lower or higher inductance values, as well.

Finally, the variable impedance matching network 400 includes a fourth inductor 415 coupled between the output node 404 and the ground reference terminal. For example, inductor 415 may have a value in a range of about 400 nH to about 800 nH, although its value may be lower and/or higher, in other embodiments.

As will be described in more detail in conjunction with FIGS. 7 and 8, a fixed impedance matching network 430 including inductors 412-415 may be physically located within the cavity (e.g., cavity 310, FIG. 3), or at least within the confines of the containment structure (e.g., containment structure 312, FIG. 3). This enables the radiation produced by the inductors 412-415 to be safely contained within the system, rather than being radiated out into the surrounding environment. In contrast, the variable inductance networks 410, 411 may or may not be contained within the cavity or the containment structure, in various embodiments.

According to an embodiment, the variable impedance matching network 400 embodiment of FIG. 4 includes "only inductors" to provide a match for the input impedance of the heating cavity 310 plus load 316. Thus, the network 400 may be considered an "inductor-only" matching network. As used herein, the phrases "only inductors" or "inductor-only" when describing the components of the variable impedance matching network means that the network does not include discrete resistors with significant resistance values or discrete capacitors with significant capacitance values. In some cases, conductive transmission lines between components of the matching network may have minimal resistances, and/or minimal parasitic capacitances may be present within the network. Such minimal resistances and/or minimal parasitic capacitances are not to be construed as converting embodiments of the "inductor-only" network into a matching network that also includes resistors and/or capacitors. Those of skill in the art would understand, however, that other embodiments of variable impedance matching networks may include differently configured inductor-only matching networks, and matching networks that include combinations of discrete inductors, discrete capacitors, and/or discrete resistors. An "inductor-only" matching network alternatively may be defined as a matching network that enables impedance matching of a capacitive load using solely or primarily inductive components.

Figure 5:
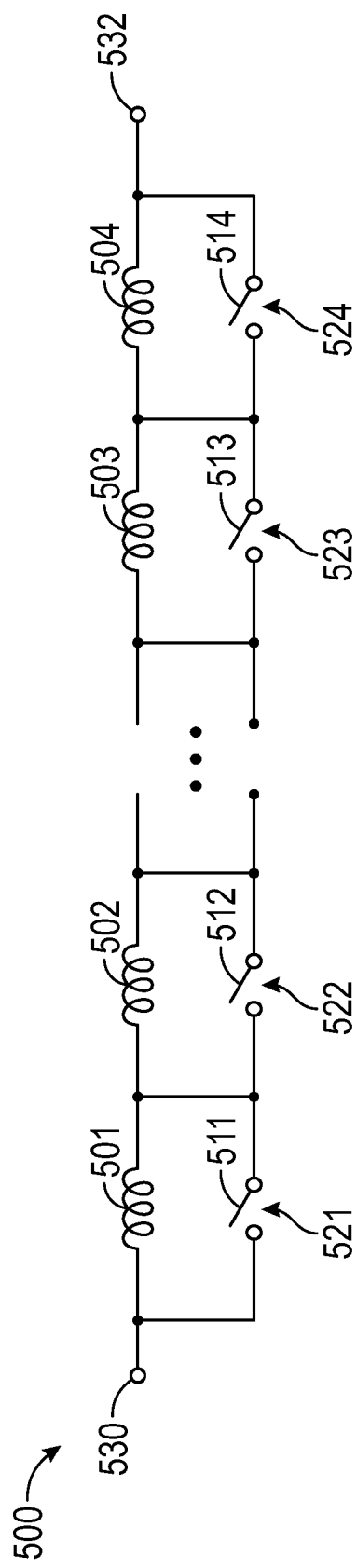
FIG. 5 is a schematic diagram of a variable inductance network, in accordance with an example embodiment.

FIG. 5 is a schematic diagram of a variable inductance network 500 that may be incorporated into a variable impedance matching network (e.g., as variable inductance networks 410 and/or 411, FIG. 4), in accordance with an example embodiment. Network 500 includes an input node 530, an output node 532, and a plurality, N, of discrete inductors 501-504 coupled in series with each other between the input and output nodes 530, 523, where N may be an integer between 2 and 10, or more. In addition, network 500 includes a plurality, N, of switches 511-514, where each switch 511-514 is coupled in parallel across the terminals of one of the inductors 501-504. Switches 511-514 may be implemented as transistors, mechanical relays or mechanical switches, for example. The electrically conductive state of each switch 511-514 (i.e., open or closed) is controlled using control signals 521-524 from the system controller (e.g., system controller 330, FIG. 3).

For each parallel inductor/switch combination, substantially all current flows through the inductor when its corresponding switch is in an open or non-conductive state, and substantially all current flows through the switch when the switch is in a closed or conductive state. For example, when all switches 511-514 are open, as illustrated in FIG. 7, substantially all current flowing between input and output nodes 530, 532 flows through the series of inductors 501-504. This configuration represents the maximum inductance state of the network 500 (i.e., the state of network 500 in which a maximum inductance value is present between input and output nodes 530, 532). Conversely, when all switches 511-514 are closed, substantially all current flowing between input and output nodes 530, 532 bypasses the inductors 501-504 and flows instead through the switches 511-514 and the conductive interconnections between nodes 530, 532 and switches 511-514. This configuration represents the minimum inductance state of the network 500 (i.e., the state of network 500 in which a minimum inductance value is present between input and output nodes 530, 532). Ideally, the minimum inductance value would be near zero inductance. However, in practice a "trace" inductance is present in the minimum inductance state due to the cumulative inductances of the switches 511-514 and the conductive interconnections between nodes 530, 532 and the switches 511-514. For example, in the minimum inductance state, the trace inductance for the variable inductance network 500 may be in a range of about 20 nH to about 50 nH, although the trace inductance may be smaller or larger, as well. Larger, smaller, or substantially similar trace inductances also may be inherent in each of the other network states, as well, where the trace inductance for any given network state is a summation of the inductances of the sequence of conductors and switches through which the current primarily is carried through the network 500.

Starting from the maximum inductance state in which all switches 511-514 are open, the system controller may provide control signals 521-524 that result in the closure of any combination of switches 511-514 in order to reduce the inductance of the network 500 by bypassing corresponding combinations of inductors 501-504. In one embodiment, each inductor 501-504 has substantially the same inductance value, referred to herein as a normalized value of I. For example, each inductor 501-504 may have a value in a range of about 100 nH to about 200 nH, or some other value. In such an embodiment, the maximum inductance value for the network 500 (i.e., when all switches 511-514 are in an open state) would be about N×I, plus any trace inductance that may be present in the network 500 when it is in the maximum inductance state. When any n switches are in a closed state, the inductance value for the network 500 would be about (N−n)×I (plus trace inductance). In such an embodiment, the state of the network 500 may be configured to have any of N+1 values of inductance.

In an alternate embodiment, the inductors 501-504 may have different values from each other. For example, moving from the input node 530 toward the output node 532, the first inductor 501 may have a normalized inductance value of I, and each subsequent inductor 502-504 in the series may have a larger or smaller inductance value. For example, each subsequent inductor 502-504 may have an inductance value that is a multiple (e.g., about twice) the inductance value of the nearest downstream inductor 501-503, although the difference may not necessarily be an integer multiple. In such an embodiment, the state of the network 500 may be configured to have any of $2^N$ values of inductance. For example, when N=4 and each inductor 501-504 has a different value, the network 500 may be configured to have any of 16 values of inductance. For example but not by way of limitation, assuming that inductor 501 has a value of I, inductor 502 has a value of 2×I, inductor 503 has a value of 4×I, and inductor 504 has a value of 8×I, Table 1, below indicates the total inductance value for all 16 possible states of the network 500 (not accounting for trace inductances):

TABLE 1

Total inductance values for all possible variable inductance network states

| Network state | Switch 511 state (501 value = I) | Switch 512 state (502 value = 2 × I) | Switch 513 state (503 value = 4 × I) | Switch 514 state (504 value = 8 × I) | Total network inductance (w/o trace inductance) |
|---|---|---|---|---|---|
| 0 | closed | closed | closed | closed | 0 |
| 1 | open | closed | closed | closed | I |
| 2 | closed | open | closed | closed | 2 × I |
| 3 | open | open | closed | closed | 3 × I |
| 4 | closed | closed | open | closed | 4 × I |
| 5 | open | closed | open | closed | 5 × I |
| 6 | closed | open | open | closed | 6 × I |
| 7 | open | open | open | closed | 7 × I |
| 8 | closed | closed | closed | open | 8 × I |
| 9 | open | closed | closed | open | 9 × I |
| 10 | closed | open | closed | open | 10 × I |
| 11 | open | open | closed | open | 11 × I |
| 12 | closed | closed | open | open | 12 × I |
| 13 | open | closed | open | open | 13 × I |
| 14 | closed | open | open | open | 14 × I |
| 15 | open | open | open | open | 15 × I |

Referring again to FIG. 4, an embodiment of variable inductance network 410 may be implemented in the form of variable inductance network 500 with the above-described example characteristics (i.e., N=4 and each successive inductor is about twice the inductance of the preceding inductor). Assuming that the trace inductance in the minimum inductance state is about 20 nH, and the range of inductance values achievable by network 410 is about 20 nH (trace inductance) to about 400 nH, the values of inductors 501-504 may be, for example, about 30 nH, about 50 nH, about 100 nH, and about 200 nH, respectively. Similarly, if an embodiment of variable inductance network 411 is implemented in the same manner, and assuming that the trace inductance is about 50 nH and the range of inductance values achievable by network 411 is about 50 nH (trace inductance) to about 800 nH, the values of inductors 501-504 may be, for example, about 50 nH, about 100 nH, about 200 nH, and about 400 nH, respectively. Of course, more or fewer than four inductors 501-504 may be included in either variable inductance network 410, 411, and the inductors within each network 410, 411 may have different values.

Although the above example embodiment specifies that the number of switched inductances in the network 500 equals four, and that each inductor 501-504 has a value that is some multiple of a value of I, alternate embodiments of variable inductance networks may have more or fewer than four inductors, different relative values for the inductors, a different number of possible network states, and/or a different configuration of inductors (e.g., differently connected sets of parallel and/or series coupled inductors). Either way, by providing a variable inductance network in an impedance matching network of a heating system, the system may be better able to match the ever-changing cavity input impedance that is present during a heating operation.

Figure 6:
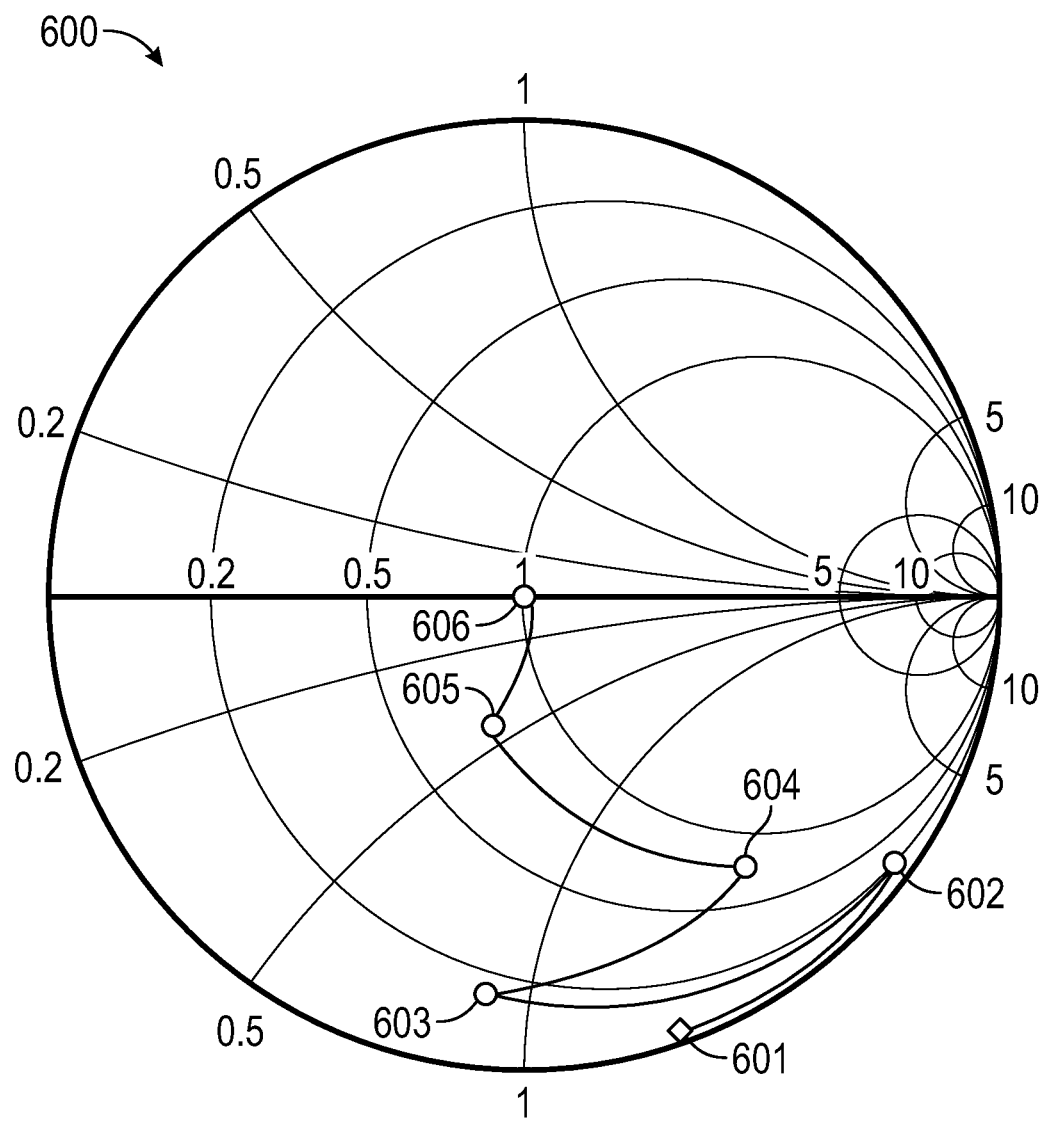
FIG. 6 is an example of a Smith chart depicting how a plurality of inductances in an embodiment of a variable impedance matching network may match the input cavity impedance to an RF signal source.

FIG. 6 is an example of a Smith chart 600 depicting how the plurality of inductances in an embodiment of a variable impedance matching network (e.g., network 360, 400, FIGS. 3, 4) may match the input cavity impedance to the RF signal source. The example Smith chart 600 assumes that the system is a 50 Ohm system, and that the output of the RF signal source is 50 Ohms. Those of skill in the art would understand, based on the description herein, how the Smith chart could be modified for a system and/or RF signal source with different characteristic impedances.

In Smith chart 600, point 601 corresponds to the point at which the load (e.g., the cavity 310 plus load 316, FIG. 3) would locate (e.g., at the beginning of a heating operation) absent the matching provided by the variable impedance matching network (e.g., network 360, 400, FIGS. 3, 4). As indicated by the position of the load point 601 in the lower right quadrant of the Smith chart 600, the load is a capacitive load. According to an embodiment, the shunt and series inductances of the variable impedance matching network sequentially move the substantially-capacitive load impedance toward an optimal matching point 606 (e.g., 50 Ohms) at which RF energy transfer to the load may occur with minimal losses. More specifically, and referring also to FIG. 4, shunt inductance 415 moves the impedance to point 602, series inductance 414 moves the impedance to point 603, shunt inductance 416 moves the impedance to point 604, series inductance 412 moves the impedance to point 605, and shunt inductance 410 moves the impedance to the optimal matching point 606.

It should be noted that the combination of impedance transformations provided by embodiments of the variable impedance matching network keep the impedance at any point within or very close to the lower right quadrant of the Smith chart 600. As this quadrant of the Smith chart 600 is characterized by relatively high impedances and relatively low currents, the impedance transformation is achieved without exposing components of the circuit to relatively high and potentially damaging currents. Accordingly, an alternate definition of an "inductor-only" matching network, as used herein, may be a matching network that enables impedance matching of a capacitive load using solely or primarily inductive components, where the impedance matching network performs the transformation substantially within the lower right quadrant of the Smith chart.

As discussed previously, the impedance of the load changes during the heating operation. Accordingly, point 601 correspondingly moves during the heating operation. Movement of load point 601 is compensated for, according to the previously-described embodiments, by varying the impedance of the first and second shunt inductances 410, 411 so that the final match provided by the variable impedance matching network still may arrive at or near the optimal matching point 606. Although a specific variable impedance matching network has been illustrated and described herein, those of skill in the art would understand, based on the description herein, that differently-configured variable impedance matching networks may achieve the same or similar results to those conveyed by Smith chart 600. For example, alternative embodiments of a variable impedance matching network may have more or fewer shunt and/or series inductances, and or different ones of the inductances may be configured as variable inductance networks (e.g., including one or more of the series inductances). Accordingly, although a particular variable inductance matching network has been illustrated and described herein, the inventive subject matter is not limited to the illustrated and described embodiment.

A particular physical configuration of a heating system will now be described in conjunction with FIG. 7. More particularly, FIG. 7 is a cross-sectional, side view of a heating system 700, in accordance with an example embodiment. The heating system 700 generally includes a heating cavity 774, a user interface (not shown), a system controller 730, an RF signal source 740, power supply and bias circuitry (not shown), power detection circuitry 780, a variable impedance matching network 760, a first electrode 770, and a second electrode 772 (e.g., which may be part of containment structure 750, or, in other embodiments, may be imbedded in a removable drawer or platform (not shown)), in an embodiment. In addition, in some embodiments, heating system 700 may include weight sensor(s) 790, temperature sensor(s), and/or IR sensor(s) 792.

The heating system 700 is contained within a containment structure 750, in an embodiment. According to an embodiment, the containment structure 750 may define three interior areas: the heating cavity 774, a fixed inductor area 776, and a circuit housing area 778. The containment structure 750 includes bottom, top, and side walls. Portions of the interior surfaces of some of the walls of the containment structure 750 may define the heating cavity 774. The heating cavity 774 includes a capacitive heating arrangement with first and second parallel plate electrodes 770, 772 that are separated by an air cavity within which a load 716 to be heated may be placed. For example, the first electrode 770 may be positioned above the air cavity, and a second electrode 772 may be provided by a conductive portion of the containment structure 750 (e.g., a portion of the bottom wall of the containment structure 750). Alternatively, the second electrode 772 may be formed from a conductive plate that is distinct from the containment structure 750 (e.g., as part of a removable drawer or platform). According to an embodiment, non-electrically conductive support structure(s) 754 may be employed to suspend the first electrode 770 above the air cavity, to electrically isolate the first electrode 770 from the containment structure 750, and to hold the first electrode 770 in a fixed physical orientation with respect to the air cavity.

According to an embodiment, the containment structure 750 is at least partially formed from conductive material, and the conductive portion(s) of the containment structure may be grounded to provide a ground reference for various electrical components of the system. Containment structure 750 may provide RF shielding for various electrical components of the system and may prevent RF signals generated by these electrical components (e.g., the first electrode 770, inductors 709) from exiting containment structure 750, or may otherwise suppress such RF signals. Alternatively, at least the portion of the containment structure 750 that corresponds to the second electrode 772 may be formed from conductive material and grounded. To avoid direct contact between the load 716 and the second electrode 772, a non-conductive barrier 756 may be positioned over the second electrode 772.

When included in the system 700, the weight sensor(s) 790 are positioned under the load 716. The weight sensor(s) 790 are configured to provide an estimate of the weight of the load 716 to the system controller 730. The temperature sensor(s) and/or IR sensor(s) 792 may be positioned in locations that enable the temperature of the load 716 to be sensed both before, during, and after a heating operation. According to an embodiment, the temperature sensor(s) and/or IR sensor(s) 792 are configured to provide load temperature estimates to the system controller 730.

Some or all of the various components of the system controller 730, the RF signal source 740, the power supply and bias circuitry (not shown), the power detection circuitry 780, and portions 710, 711 of the variable impedance matching network 760, may be coupled to a common substrate 752 within the circuit housing area 778 of the containment structure 750, in an embodiment. According to an embodiment, the system controller 730 is coupled to the user interface, RF signal source 740, variable impedance matching network 760, and power detection circuitry 780 through various conductive interconnects on or within the common substrate 752. In addition, the power detection circuitry 780 is coupled along the transmission path 748 between the output of the RF signal source 740 and the input 702 to the variable impedance matching network 760, in an embodiment. For example, the substrate 752 may include a microwave or RF laminate, a polytetrafluoroethylene (PTFE) substrate, a printed circuit board (PCB) material substrate (e.g., FR-4), an alumina substrate, a ceramic tile, or another type of substrate. In various alternate embodiments, various ones of the components may be coupled to different substrates with electrical interconnections between the substrates and components. In still other alternate embodiments, some or all of the components may be coupled to a cavity wall, rather than being coupled to a distinct substrate.

The first electrode 770 is electrically coupled to the RF signal source 740 through a variable impedance matching network 760 and a transmission path 748, in an embodiment. As discussed previously, the variable impedance matching network 760 includes variable inductance networks 710, 711 (e.g., networks 410, 411, FIG. 4) and a plurality of fixed-value planar inductors 709 (e.g., inductors 412-415, 812-815, FIGS. 4, 8). While inductors 709 are shown here as being disposed on a single side of substrate 724, it should be noted that, in some embodiments, inductors 709 may also be formed on the opposite side of substrate 724 and/or in metallized layers internal to substrate 724 for embodiments in which substrate 724 is a multi-layer substrate. For example, the substrate 724 may include a microwave or RF laminate, a polytetrafluoroethylene (PTFE) substrate, a printed circuit board (PCB) material substrate (e.g., FR-4), an alumina substrate, a ceramic tile, or another type of substrate. In an embodiment, the variable inductance networks 710, 711 are coupled to the common substrate 752 and located within the circuit housing area 778. In contrast, the fixed-value inductors 709 are positioned within the fixed inductor area 776 of the containment structure 750 (e.g., between the common substrate 752 and the first electrode 770). Conductive structures (e.g., conductive vias or other structures) may provide for electrical communication between the circuitry within the circuit housing area 778 and the planar inductors 709 within the fixed inductor area 776.

Figure 7:
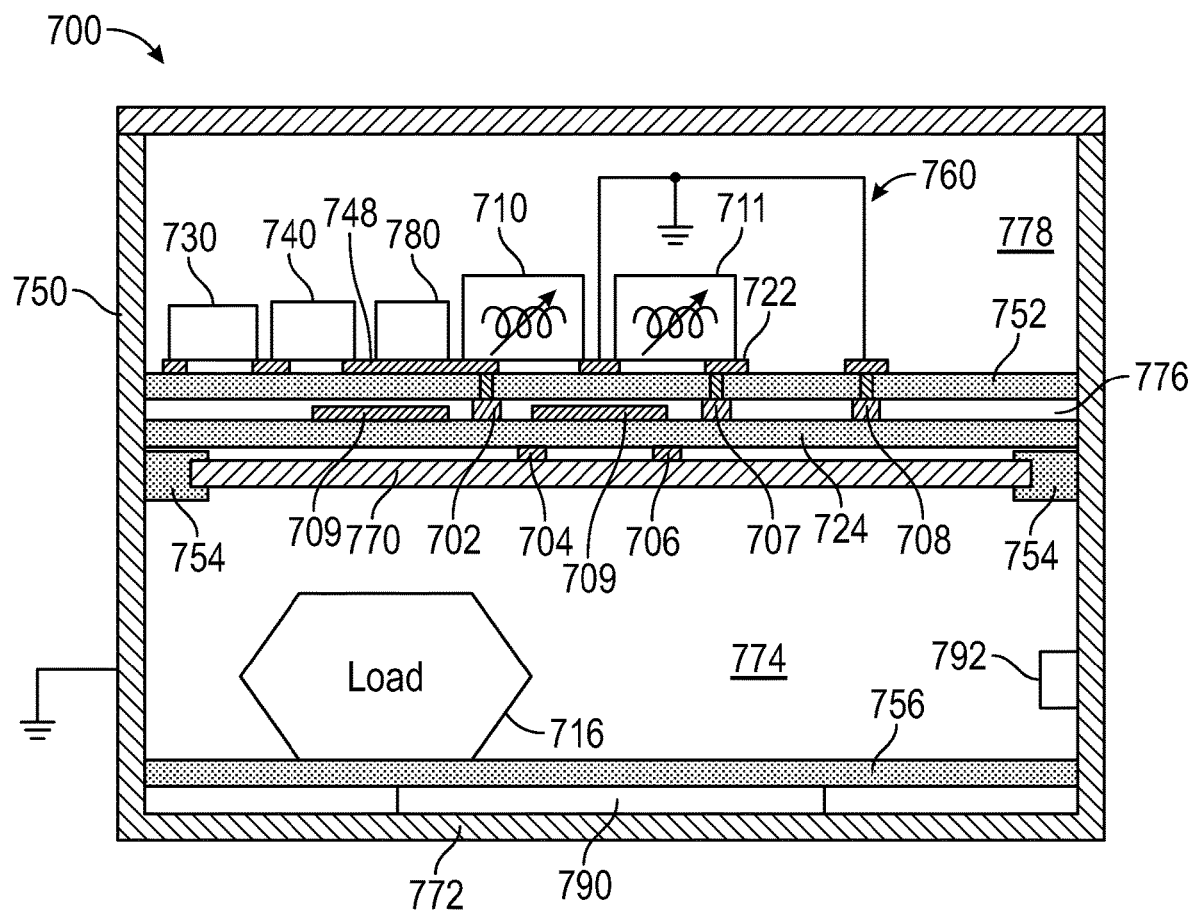
FIG. 7 is a cross-sectional, side view of a heating system, in accordance with an example embodiment.

For enhanced understanding of the system 700, the nodes and components of the variable impedance matching network 760 depicted in FIG. 7 will now be correlated with nodes and components of the impedance matching network 400 and fixed impedance matching network 800 depicted in FIGS. 4 and 8. More specifically, the variable impedance matching network 760 includes an input node 702 (e.g., input node 402, 802, FIGS. 4, 8), output nodes 704, 706 (e.g., output node 404, 804, 806, FIGS. 4, 8), first and second variable inductance networks 710, 711 (e.g., variable inductance networks 410, 411, FIG. 4), and a plurality of fixed-value inductors 709 (e.g., inductors 412-415, 812-815, FIGS. 4, 8), according to an embodiment. The input node 702 is electrically coupled to an output of the RF signal source 740 through various conductive structures (e.g., conductive vias and traces), and the output nodes 704, 706 are electrically coupled to the first electrode 770. A ground reference node 708 (e.g., that is grounded through the containment structure 750) is electrically coupled to one or more inductors (e.g., inductor 812, FIG. 8) of the inductors 709 (e.g., through conductive traces on substrate 724), according to an embodiment.

Between the input node 702 and the output nodes 704, 706 (e.g., input and output nodes 402, 404, 802, 804, 806, FIGS. 4, 8), the variable impedance matching network 700 includes four inductors 709 (e.g., inductors 412-415, 812-815, FIGS. 4, 8), in an embodiment, which are positioned within the fixed inductor area 776.

The first variable inductance network 710 (e.g., network 410, FIG. 4) is electrically coupled between the input node 702 and a ground reference terminal (e.g., the grounded containment structure 750). Finally, the second shunt variable inductance network 711 e.g., network 411, FIG. 4) is electrically coupled between the second intermediate node 722 and the ground reference terminal. The second intermediate node 722 may be electrically coupled to a node 707 through one or more vias in common substrate 752, and may be electrically coupled to one or more inductors (e.g., inductor 813, FIG. 8) of inductors 709.

Figure 8A:
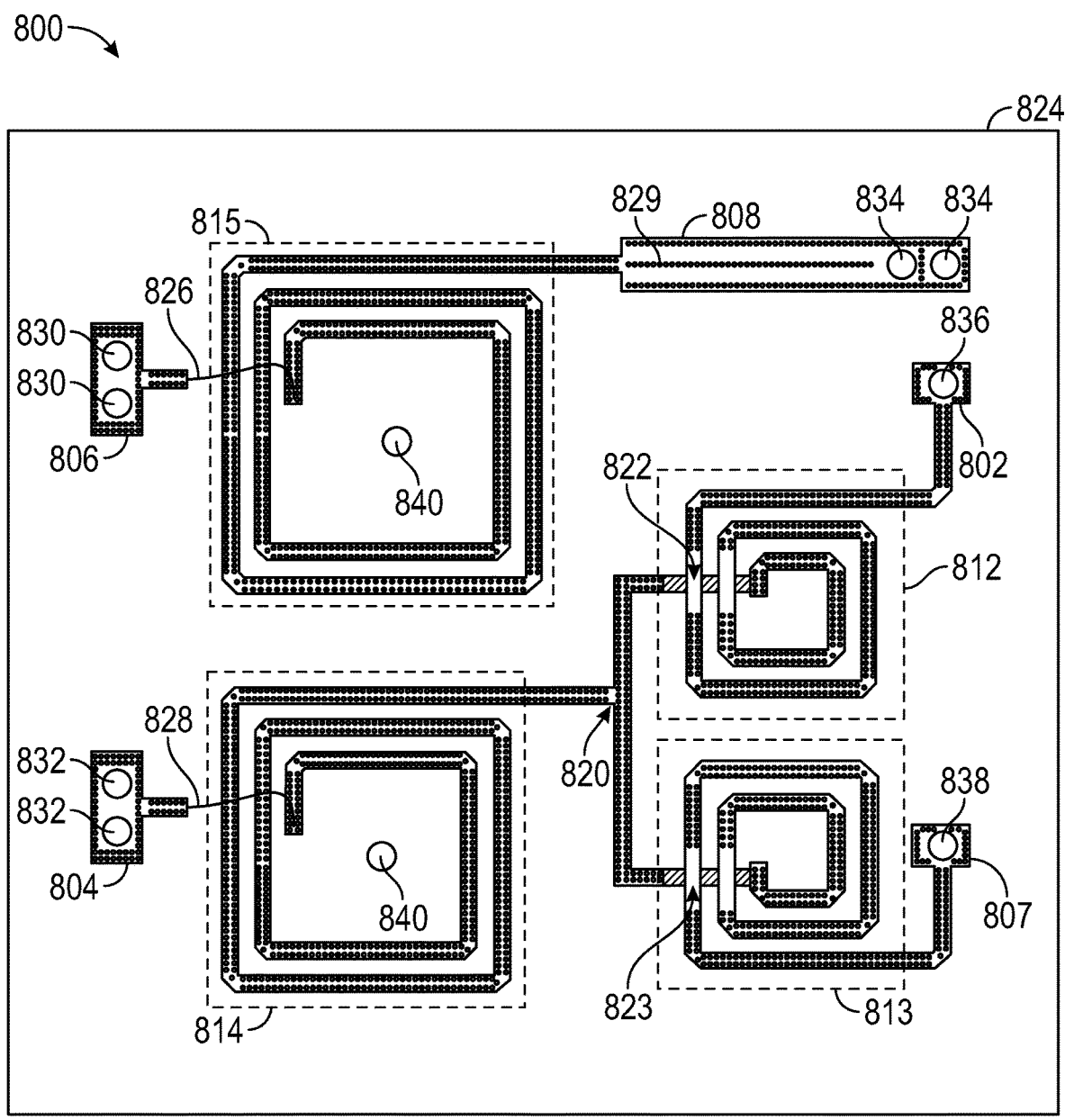
FIG. 8A is a top view of a planar inductor circuit disposed on a substrate, in accordance with an example embodiment.
Figure 8B:
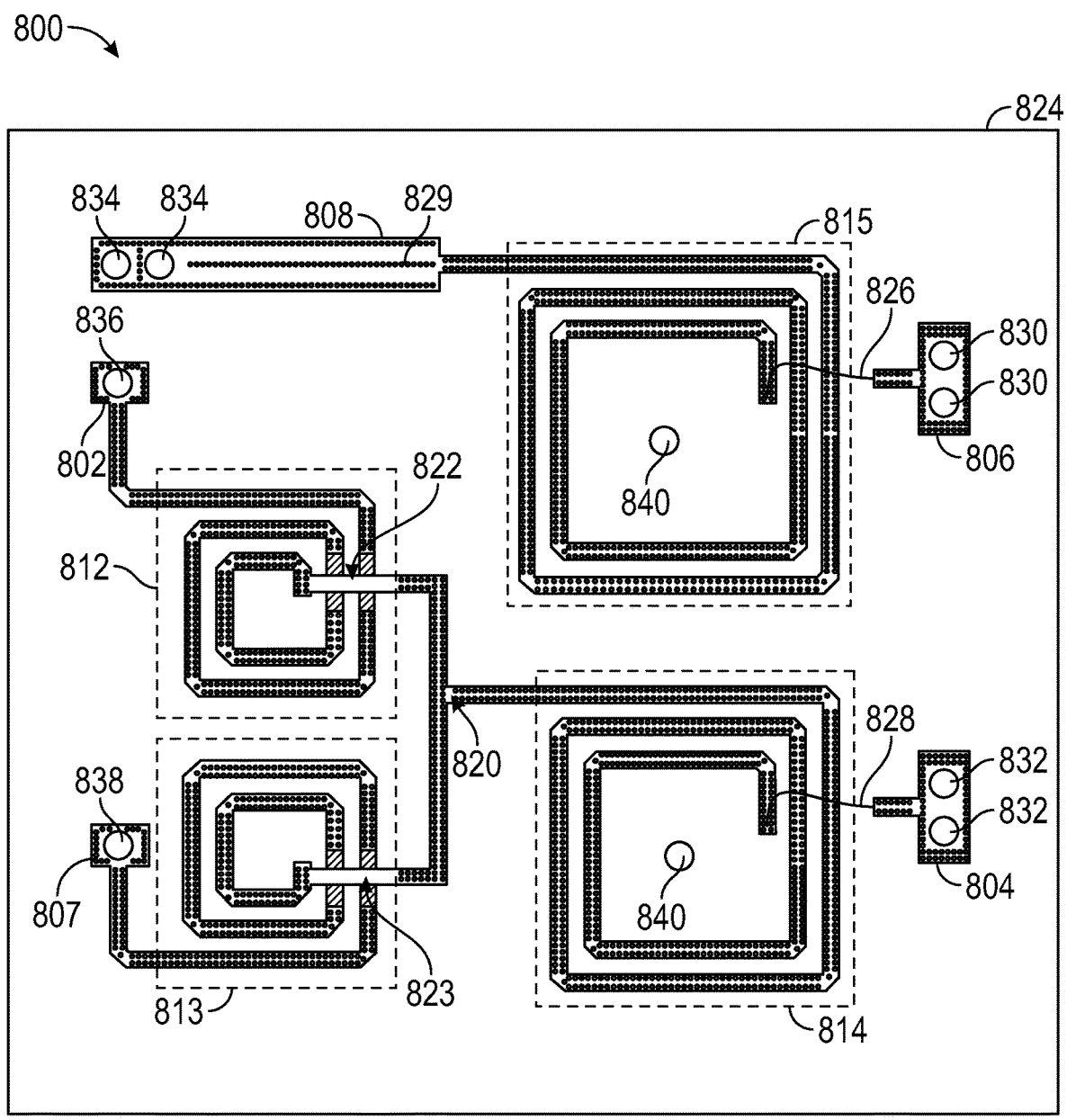
FIG. 8B is a bottom view of a planar inductor circuit disposed on a substrate, in accordance with an example embodiment.

A particular physical configuration of a fixed impedance network (e.g., considered here to include substrate 724, inductors 709, output nodes 704, 706, node 707, ground reference node 708, and input node 702, FIG. 7) that may be used, for example, in heating system 700 of FIG. 7, is now described in conjunction with FIGS. 8A and 8B. More particularly, FIG. 8A is a top view of a fixed impedance network 800, while FIG. 8B is a bottom view of the fixed impedance network 800, in accordance with an embodiment. It should be noted that, as used here, the terms "top view" and "top side" are primarily used in reference to a first side of a substrate 824 on which conductive elements of the fixed impedance network 800 are formed, and the terms "bottom view" and "bottom side" are primarily used in reference a second side of the substrate 824 that is opposite to the first side of the substrate 824 and on which additional conductive elements of the fixed impedance network 800 are formed. The modifiers "top" and "bottom" are not intended to necessitate any particular arrangement of fixed impedance network 800 when implemented in a heating system.

The fixed impedance network 800 (e.g., fixed impedance matching network 430, FIG. 4) generally includes a substrate 824 on/in which planar inductors 812-815, vias 829, 830, 832, 834, 836, 838, 840, input node 802, a node 807, output nodes 804, 806, a ground reference node 808, and a node 820 are disposed. The substrate 824 (e.g., the substrate 724, FIG. 7) may be disposed in an inductor cavity (e.g., the cavity 776, FIG. 7) of a containment structure (e.g., the containment structure 750, FIG. 7) of a heating system (e.g., the heating system 700). The inductor 815 (e.g., the inductor 414, FIG. 4) is electrically coupled between the ground reference node 808 (e.g., the ground reference node 708, FIG. 7) and the output node 806 (e.g., the output node 706, FIG. 7). The ground reference node 808 may be, for example, electrically coupled to a grounded conductive portion of the containment structure of the heating system in which the fixed impedance network 800 is implemented. The inductor 815 may be coupled to the output node 806 through one or more bond wires 826, which may be disposed on the top side and/or the bottom side of the substrate 824. The output node 806 may be, for example, electrically coupled to an electrode (e.g., the electrode 770, FIG. 7). The inductor 814 (e.g., the inductor 414, FIG. 4) is electrically coupled between the output node 804 (e.g., the output node 404, 704, FIGS. 4, 7) and the node 820 (e.g., the node 420, FIG. 4). The inductor 814 may be, for example, electrically coupled to the output node 804 through one or more bond wires 828, which may be disposed on the top side and/or the bottom side of the substrate 824. The output node 804 may be, for example, electrically coupled to the same electrode (e.g., the electrode 770, FIG. 7) that the output node 806 is coupled to (although the respective physical couplings may occur at different locations on the electrode). The inductor 812 (e.g., the inductor 412, FIG. 4) is electrically coupled between the input node 802 and the node 820. The input node 802 may be, for example, electrically coupled to a RF signal source (e.g., the RF signal source 730, FIG. 7) through a transmission path (e.g., the transmission path 748, FIG. 7). The inductor 812 may include a crossover region 822 in which an inductor path on the bottom side of the substrate 824 crosses over two inductor paths on the top side of the substrate 824. For embodiments in which substrate 824 is a multi-layer substrate that includes internal conductive layers from which portions of inductor 812 are formed, the internal conductive layers may be excluded from the crossover region 822. The inductor 813 (e.g., the inductor 413, FIG. 4) is electrically coupled between the node 807 (e.g., the node 707, FIG. 7) and the node 820. The node 807 may be, for example, electrically coupled to a variable inductor network (e.g., variable inductor network 411, 711, FIGS. 4, 7) through an intermediate node (e.g., intermediate node 422, 722, FIGS. 4, 7). The inductor 813 may include a crossover region 823 in which an inductor path on the bottom side of the substrate 824 crosses over two inductor paths on the top side of the substrate 824. For embodiments in which substrate 824 is a multi-layer substrate that includes internal conductive layers from which portions of inductor 813 are formed, the internal conductive layers may be excluded from the crossover region 823.

Conductive layers that make up and connect the inductors 812-815, the input node 802, the node 807, the output nodes 804, 806, the ground reference node 808, and the node 820 may include multiple small vias 829. These conductive layers may be copper, silver coated copper, or any other applicable conductive material. Larger vias 830, 832, 834, 836, 838 (e.g., larger than vias 829) may be included at the nodes 806, 804, 808, 802, 807, respectively, and may be used for electrically coupling these nodes to external circuitry in a heating system (e.g., as described above) as well as for mounting the substrate 824 in the heating system (e.g., by attaching substrate 824 to the heating system using screws, bolts, or other appropriate attachment hardware elements that pass through the larger vias 830, 832, 834, 836, 838). Vias 840 may also be included in the substrate 804 at the respective centers of the inductors 814, 815, and may also be used for mounting the substrate 824 in the heating system (e.g., using screws, bolts, or other appropriate attachment hardware that pass through vias 840). The vias 829, 830, 832, 834, 836, 838 may extend between the top side and the back side of the substrate 824 and may include conductive side-walls that electrically couple different conductive layers of substrate 824 together. Further, the vias 829, 830, 832, 834, 836, 838, 840 may be filled with air, which may provide heat dissipation for the fixed impedance matching network 800.

The layout of the inductors 812-815 may be optimized to minimize coupling between the inductors 812-815 while also meeting predetermined impedance characteristics. These predetermined impedance characteristics may vary depending on the particular heating system in which the fixed impedance matching network 800 is to be used.

The inductors 812-815, the input node 802, the node 807, the output nodes 804, 806, the ground reference node 808, and the node 820 may be formed from one or more conductive layers disposed in and/or on the substrate 824. A cross-sectional view showing conductive layers that may be used to form some or all of these elements of in an embodiment in which the substrate 824 is a multi-layer substrate is now described in conjunction with FIG. 9.

Figure 9:
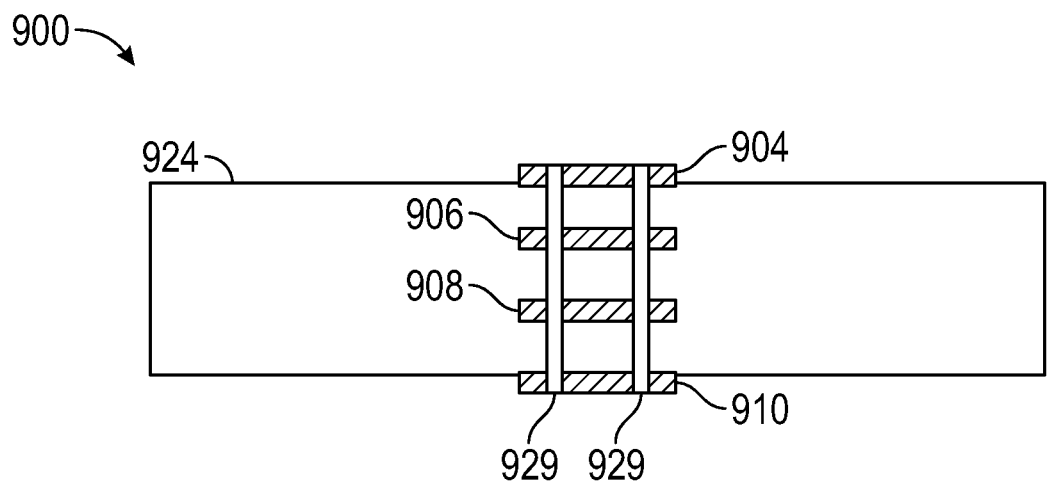
FIG. 9 is a cross-sectional side-view of a printed circuit board that includes a multi-layer planar inductor circuit trace, in accordance with an example embodiment.

More particularly, FIG. 9 is a cross-sectional side view of a section 900 of a substrate 924 (e.g., the substrate 824 of the fixed impedance network 800, FIG. 8). Substrate 924 may, for example, include a microwave or RF laminate, a polytetrafluorethylene (PTFE) substrate, a printed circuit board (PCB) material substrate (e.g., FR-4), an alumina substrate, a ceramic tile, or another type of substrate. A conductive layer 904 may be formed on a top surface of the substrate 924. In some embodiments, the conductive layer 904 may be partially or fully embedded in the top surface of the substrate 924. A conductive layer 910 may be formed on a bottom surface of the substrate 924. In some embodiments, the conductive layer 910 may be partially or fully embedded in the bottom surface of the substrate 924. Conductive layers 906, 908 may be internal conductive layers that are formed in or on internal layers of the substrate 924. The conductive layers 904, 906, 908, 910, (e.g., electrically conductive layers) may be formed from copper, silver coated copper, or any other applicable electrically conductive material. Conductive layers 904, 906, 908, 910 may respectively form conductive traces that may be used to carry electrical signals (e.g., RF signals generated by RF signal source 740, FIG. 7). Electrically conductive vias 929 (e.g., vias 829, FIG. 8) may electrically couple each of the conductive layers 904, 906, 908, 910 together, and may provide heat dissipation for the substrate 924. The four conductive layers 904, 906, 908, 910 coupled together with the vias 929 may be capable of carrying signals with higher currents (and therefore higher power), compared to signals that a single conductive layer (e.g., of similar dimensions) may be capable of handling.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

In accordance with an embodiment, a system may include a radio frequency (RF) signal source that may produce an RF signal, an impedance matching network that includes a first planar inductor, a first electrode that is electrically coupled to the RF signal source through the planar inductor of the impedance matching network, and a second electrode.

In accordance with another aspect of the embodiment, the impedance matching network may include a second planar inductor. The system may further include a ground reference terminal. The first electrode may be electrically coupled to the ground reference terminal through the second planar inductor of the impedance matching network.

In accordance with another aspect of the embodiment, the impedance matching network may further include a third planar inductor. The first electrode may be electrically coupled to the RF signal source through the first planar inductor and the third planar inductor.

In accordance with another aspect of the embodiment, the impedance matching network may further include a fourth planar inductor. The system may further include a variable inductor network. The first electrode may be electrically coupled to the ground reference terminal through the third planar inductor, the fourth planar inductor, and the variable inductor network.

In accordance with another aspect of the embodiment, the ground reference terminal may be coupled to the second electrode. The second electrode may be configured to suppress RF signals generated by the first electrode, the first planar inductor, and the second planar inductor.

In accordance with another aspect of the embodiment, the impedance matching network may further include a substrate having a first surface and having a second surface that is opposite the first surface. The first planar inductor may include a first conductive layer formed on the first surface of the substrate, a second conductive layer formed on the second surface of the substrate, and multiple internal conductive layers disposed inside the substrate between the first conductive layer and the second conductive layer.

In accordance with another aspect of the embodiment, the first planar inductor may further include a via that extends through the substrate and that includes conductive side-walls that are electrically coupled to the first conductive layer, the second conductive layer, and the multiple internal conductive layers.

In accordance with another aspect of the embodiment, the first planar inductor may further include a crossover region that includes the first conductive layer and the second conductive layer, and that excludes the multiple internal conductive layers.

In accordance with another aspect of the embodiment, the substrate may be disposed in an air cavity between the RF signal source and the first electrode.

In accordance with an embodiment, a RF heating system includes a RF signal source configured to produce a RF signal, an electrode configured to receive the RF signal from the RF signal source, and an impedance matching network. The impedance matching network may include a substrate disposed between the RF signal source and the electrode, and a first planar inductor disposed on the substrate. The RF signal source may be electrically coupled to the electrode through the first planar inductor.

In accordance with another aspect of the embodiment, wherein the impedance matching network further includes a second planar inductor. The system may further include a ground reference terminal. The electrode may be electrically coupled to the ground reference terminal through the second planar inductor of the impedance matching network.

In accordance with another aspect of the embodiment, the impedance matching network may further include a third planar inductor. The electrode may be electrically coupled to the RF signal source through the first planar inductor and the third planar inductor.

In accordance with another aspect of the embodiment, the impedance matching network may further include a fourth planar inductor. The system may further include a variable inductor network. The electrode may be electrically coupled to the ground reference terminal through the third planar inductor, the fourth planar inductor, and the first variable inductor network.

In accordance with another aspect of the embodiment, the substrate may have a first surface and may have a second surface that is opposite the first surface. The planar inductor may include a first conductive layer disposed on the first surface of the substrate, a second conductive layer disposed on the second surface of the substrate, and multiple internal conductive layers disposed inside the substrate between the first conductive layer and the second conductive layer.

In accordance with another aspect of the embodiment, the first planar inductor may further include a conductive via that electrically couples the first conductive layer to the second conductive layer through the plurality of internal conductive layers.

In accordance with another aspect of the embodiment, the first planar inductor may further include a crossover region that includes the first conductive layer and the second conductive layer, and that excludes the multiple internal conductive layers.

In accordance with an embodiment, an impedance matching network may include a substrate having a first surface and having a second surface opposite the first surface, a first node disposed on the substrate, a second node disposed on the substrate, a third node disposed on the substrate, a first planar inductor that is disposed on the substrate and that is electrically coupled to the first node, a second planar inductor that is disposed on the substrate and that is electrically coupled to the second node, and a third planar inductor that is disposed on the substrate and that is electrically coupled to the third node. The first node may be electrically coupled to the third node through the first planar inductor and the third planar inductor. The second node may be electrically coupled to the third node through the second planar inductor and the third planar inductor. The first node may be electrically coupled to the second node through the first planar inductor and the second planar inductor.

In accordance with another aspect of the embodiment, the first node may be an input node that is configured to electrically couple to an external RF signal source. The second node may be configured to electrically couple to an external ground reference terminal through an external variable impedance network. The third node may be an output node that is configured to electrically couple to an external electrode.

In accordance with another aspect of the embodiment, the impedance matching network may further include a fourth node disposed on the substrate, a fifth node disposed on the substrate, and a fourth planar inductor that is disposed on the substrate and that is electrically coupled between the fourth node and the fifth node.

In accordance with another aspect of the embodiment, the fourth node may be a ground reference node that is configured to electrically couple to the external ground reference terminal. The fifth node may be an additional output node that is configured to electrically connect to the external electrode.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

The invention claimed is:

1. A system comprising:
a radio frequency (RF) signal source configured to produce an RF signal;
an impedance matching network that includes:
a first planar inductor with a first terminal and a second terminal, wherein the first terminal of the first planar inductor is coupled to the RF signal source,
a second planar inductor with a first terminal and a second terminal, wherein the first terminal of the second planar inductor is coupled to the second terminal of the first planar inductor, and the second terminal of the second planar inductor is coupled to a ground reference terminal, and
a first variable inductor network coupled in series with the second planar inductor;
a first electrode that is electrically coupled to the second terminal of the first planar inductor of the impedance matching network; and
a second electrode.

2. The system of claim 1, wherein the impedance matching network further includes a third planar inductor with a first terminal and a second terminal, wherein the first terminal of the third planar inductor is coupled to the first electrode, and a second terminal of the third planar inductor is coupled to the ground reference terminal.

3. The system of claim 1, wherein the impedance matching network further comprises:
a third planar inductor with a first terminal and a second terminal, wherein the second terminal of the first planar inductor is electrically coupled to the first terminal of the third planar inductor, and the second terminal of the third planar inductor is electrically coupled to the first electrode.

4. The system of claim 2, wherein the ground reference terminal is coupled to the second electrode, and wherein the second electrode is configured to suppress RF signals generated by the first electrode, the first planar inductor, and the third planar inductor.

5. The system of claim 1, wherein the impedance matching network further includes a substrate having a first surface and having a second surface that is opposite the first surface, wherein the first planar inductor comprises:
a first conductive layer formed on the first surface of the substrate;
a second conductive layer formed on the second surface of the substrate; and
a plurality of internal conductive layers disposed inside the substrate between the first conductive layer and the second conductive layer.

6. The system of claim 5, wherein the first planar inductor further comprises:
a via that extends through the substrate and that comprises conductive side-walls that are electrically coupled to the first conductive layer, the second conductive layer, and the plurality of internal conductive layers.

7. The system of claim 6, wherein the first planar inductor further comprises:
a crossover region that includes the first conductive layer and the second conductive layer and that excludes the plurality of internal conductive layers.

8. The system of claim 5, wherein the substrate is disposed in an air cavity between the RF signal source and the first electrode.

9. A radio frequency (RF) heating system comprising:
a RF signal source configured to produce a RF signal;
an electrode configured to receive the RF signal from the RF signal source; and
an impedance matching network including:
a substrate disposed between the RF signal source and the electrode,
a first planar inductor disposed on the substrate, wherein the first planar inductor has a first terminal and a second terminal, wherein the first terminal of the first planar inductor is coupled to the RF signal source, and the second terminal of the first planar inductor is electrically coupled to the electrode,
a second planar inductor disposed on the substrate, wherein the second planar inductor has a first terminal and a second terminal, wherein the first terminal of the second planar inductor is coupled to the second terminal of the first planar inductor, and the second terminal of the second planar inductor is coupled to a ground reference terminal, and
a first variable inductor network coupled in series with the second planar inductor.

10. The system of claim 9, wherein the impedance matching network further includes a third planar inductor with a first terminal and a second terminal, wherein the first terminal of the third planar inductor is coupled to the first electrode, and a second terminal of the third planar inductor is coupled to the ground reference terminal.

11. The system of claim 9, wherein the impedance matching network further comprises:
a third planar inductor with a first terminal and a second terminal, wherein the second terminal of the first planar inductor is electrically coupled to the first terminal of the third planar inductor, and the second terminal of the third planar inductor is electrically coupled to the first electrode.

12. The system of claim 9, wherein the substrate has a first surface and has a second surface that is opposite the first surface, wherein the first planar inductor comprises:
   a first conductive layer disposed on the first surface of the substrate;
   a second conductive layer disposed on the second surface of the substrate; and
   a plurality of internal conductive layers disposed inside the substrate between the first conductive layer and the second conductive layer.

13. The system of claim 12, wherein the first planar inductor further comprises:
   a conductive via that electrically couples the first conductive layer to the second conductive layer through the plurality of internal conductive layers.

14. The system of claim 13, wherein the first planar inductor further comprises:
   a crossover region that includes the first conductive layer and the second conductive layer and that excludes the plurality of internal conductive layers.

15. An impedance matching network comprising:
   a substrate having a first surface and having a second surface opposite the first surface;
   a first node disposed on the substrate;
   a second node disposed on the substrate;
   a third node disposed on the substrate;
   a fourth node disposed on the substrate;
   a first planar inductor that is disposed on the substrate and that is electrically coupled between the first node and the fourth node;
   a second planar inductor that is disposed on the substrate and that is electrically coupled between the fourth node and the second node;
   a third planar inductor that is disposed on the substrate and that is electrically coupled between the fourth node and the third node, wherein the first node is electrically coupled to the third node through the first planar inductor and the third planar inductor, and wherein the second node is electrically coupled to the third node through the second planar inductor and the third planar inductor, and wherein the first node is electrically coupled to the second node through the first planar inductor and the second planar inductor; and
   a first external variable impedance network, wherein the first external variable impedance network and the second planar inductor are coupled in series between the fourth node and a ground reference terminal.

16. The impedance matching network of claim 15, wherein the first node is an input node that is configured to electrically couple to an external radio frequency (RF) signal source, and wherein the third node is an output node that is configured to electrically couple to an external electrode.

17. The impedance matching network of claim 16, further comprising:
   a fourth planar inductor that is disposed on the substrate and that is electrically coupled between the third node and the ground reference terminal.

18. The system of claim 1, further comprising:
   a second variable inductor network coupled between the first terminal of the first planar inductor and the ground reference terminal.

19. The system of claim 9, further comprising:
   a second variable inductor network coupled between the first terminal of the first planar inductor and the ground reference terminal.

20. The impedance matching network of claim 15, further comprising:
   a second external variable impedance network coupled between the first node and the ground reference terminal.

* * * * *